US012763550B2

(12) United States Patent
Zhao et al.

(10) Patent No.: US 12,763,550 B2
(45) Date of Patent: Oct. 13, 2026

(54) MULTIPHASE GROWTH SEQUENCE FOR FORMING A VERTICAL CAVITY SURFACE EMITTING LASER

(71) Applicant: Lumentum Operations LLC, San Jose, CA (US)

(72) Inventors: Guowei Zhao, Milpitas, CA (US); Jun Yang, Cupertino, CA (US); Ajit Vijay Barve, San Jose, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 941 days.

(21) Appl. No.: 17/364,443

(22) Filed: Jun. 30, 2021

(65) Prior Publication Data

US 2022/0209501 A1 Jun. 30, 2022

Related U.S. Application Data

(60) Provisional application No. 63/132,843, filed on Dec. 31, 2020.

(51) Int. Cl.

*H01S 5/183* (2006.01)
*H01S 5/30* (2006.01)
*H01S 5/34* (2006.01)
*H01S 5/343* (2006.01)

(52) U.S. Cl.

CPC ...... *H01S 5/18311* (2013.01); *H01S 5/18358* (2013.01); *H01S 5/3095* (2013.01); *H01S 5/3412* (2013.01); *H01S 5/34306* (2013.01); *H01S 2304/02* (2013.01); *H01S 2304/04* (2013.01)

(58) Field of Classification Search

CPC ....... H01S 5/183–18397; H01S 5/3095; H01S 5/18311–18313

See application file for complete search history.

(56) References Cited

U.S. PATENT DOCUMENTS 4,855,255 A * 8/1989 Goodhue .................. H01S 5/42 257/431
2001/0050934 A1 12/2001 Choquette et al.
2002/0176465 A1* 11/2002 Kondow ................ B82Y 20/00 372/45.01
2003/0157739 A1* 8/2003 Jiang ................... H01S 5/18313 257/E21.097

(Continued)

FOREIGN PATENT DOCUMENTS

EP 0472347 A2 * 2/1992

*Primary Examiner* — Sean P Hagan
(74) *Attorney, Agent, or Firm* — Harrity & Harrity, LLP

(57) ABSTRACT

A method of forming a vertical cavity surface emitting laser (VCSEL) device using a multiphase growth sequence includes forming a first mirror over a substrate; forming an active region (e.g., a dilute nitride active region) over the first mirror; forming an oxidation aperture (OA) layer over the active region; forming a spacer on a surface of the OA layer; and forming a second mirror over the spacer. The active region is formed using a molecular beam epitaxy (MBE) process during an MBE phase of the multiphase growth sequence and the second mirror is formed using a metal-organic chemical vapor deposition (MOCVD) process during an MOCVD phase of the multiphase growth sequence.

20 Claims, 6 Drawing Sheets

(56) References Cited

U.S. PATENT DOCUMENTS

| | | | | |
|---|---|---|---|---|
| 2004/0218655 | A1* | 11/2004 | Tandon | H01S 5/3095 372/96 |
| 2005/0002430 | A1 | 1/2005 | Ryou | |
| 2008/0212633 | A1* | 9/2008 | Shimizu | B82Y 20/00 372/45.011 |
| 2012/0132913 | A1* | 5/2012 | Shiu | H01L 29/0603 257/51 |
| 2015/0010031 | A1* | 1/2015 | Makino | G01N 21/4795 372/45.01 |
| 2019/0013429 | A1* | 1/2019 | Suarez | H01L 31/1848 |
| 2020/0052137 | A1* | 2/2020 | Maros | H10F 71/1274 |

* cited by examiner

MULTIPHASE GROWTH SEQUENCE FOR FORMING A VERTICAL CAVITY SURFACE EMITTING LASER

RELATED APPLICATION

This application claims priority to U.S. Provisional Patent Application No. 63/132,843, entitled "OPTIMIZED CONFIGURATION AND GROWTH SEQUENCE FOR DILUTE NITRIDE LASERS," filed on Dec. 31, 2020, the content of which is incorporated by reference herein in its entirety.

TECHNICAL FIELD

The present disclosure relates generally to a vertical cavity surface emitting laser (VCSEL) and to a multiphase growth sequence for forming a VCSEL.

BACKGROUND

A vertical-emitting device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

In some implementations, a method of forming a VCSEL device using a multiphase growth sequence includes forming a first mirror over a substrate; forming an active region over the first mirror; forming an oxidation aperture (OA) layer over the active region; forming a spacer on a surface of the OA layer; and forming a second mirror over the spacer, wherein: the active region is formed using a molecular beam epitaxy (MBE) process during an MBE phase of the multiphase growth sequence; and the second mirror is formed using a metal-organic chemical vapor deposition (MOCVD) process during an MOCVD phase of the multiphase growth sequence.

In some implementations, a method of forming a VCSEL device using a multiphase growth sequence includes forming a first mirror over a substrate; forming a first spacer on a surface of the first mirror; forming an active region over the first spacer; forming an OA layer over the active region; forming a second spacer on a surface of the OA layer; and forming a second mirror over the second spacer, wherein: the first mirror and the first spacer are formed using an MOCVD process during a first MOCVD phase of the multiphase growth sequence; the active region is formed using an MBE process during an MBE phase of the multiphase growth sequence; and the second mirror is formed using a second MOCVD process during a second MOCVD phase of the multiphase growth sequence.

In some implementations, a method of forming a VCSEL device using a multiphase growth sequence includes forming a first mirror over a substrate; forming an active region over the first mirror; forming an OA layer over the active region; forming a spacer on a surface of the OA layer; forming a second mirror over the spacer; and forming a cap layer over the second mirror, wherein: the active region, the OA layer, and the spacer are formed using an MBE process during an MBE phase of the multiphase growth sequence; and the second mirror and the cap layer are formed using an MOCVD process during an MOCVD phase of the multiphase growth sequence.

In some implementations, a method of forming a VCSEL device using a multiphase growth sequence includes forming a first mirror over a substrate; forming a first spacer on a surface of the first mirror; forming an active region over the first spacer; forming an OA layer over the active region; forming a second spacer on a surface of the OA layer; forming a second mirror over the second spacer; and forming a cap layer over the second mirror, wherein: the first mirror and the first spacer are formed using an MOCVD process during a first MOCVD phase of the multiphase growth sequence; the active region is formed using an MBE process during an MBE phase of the multiphase growth sequence; and the second mirror and the cap layer are formed using a second MOCVD process during a second MOCVD phase of the multiphase growth sequence.

DETAILED DESCRIPTION

Figure 1:
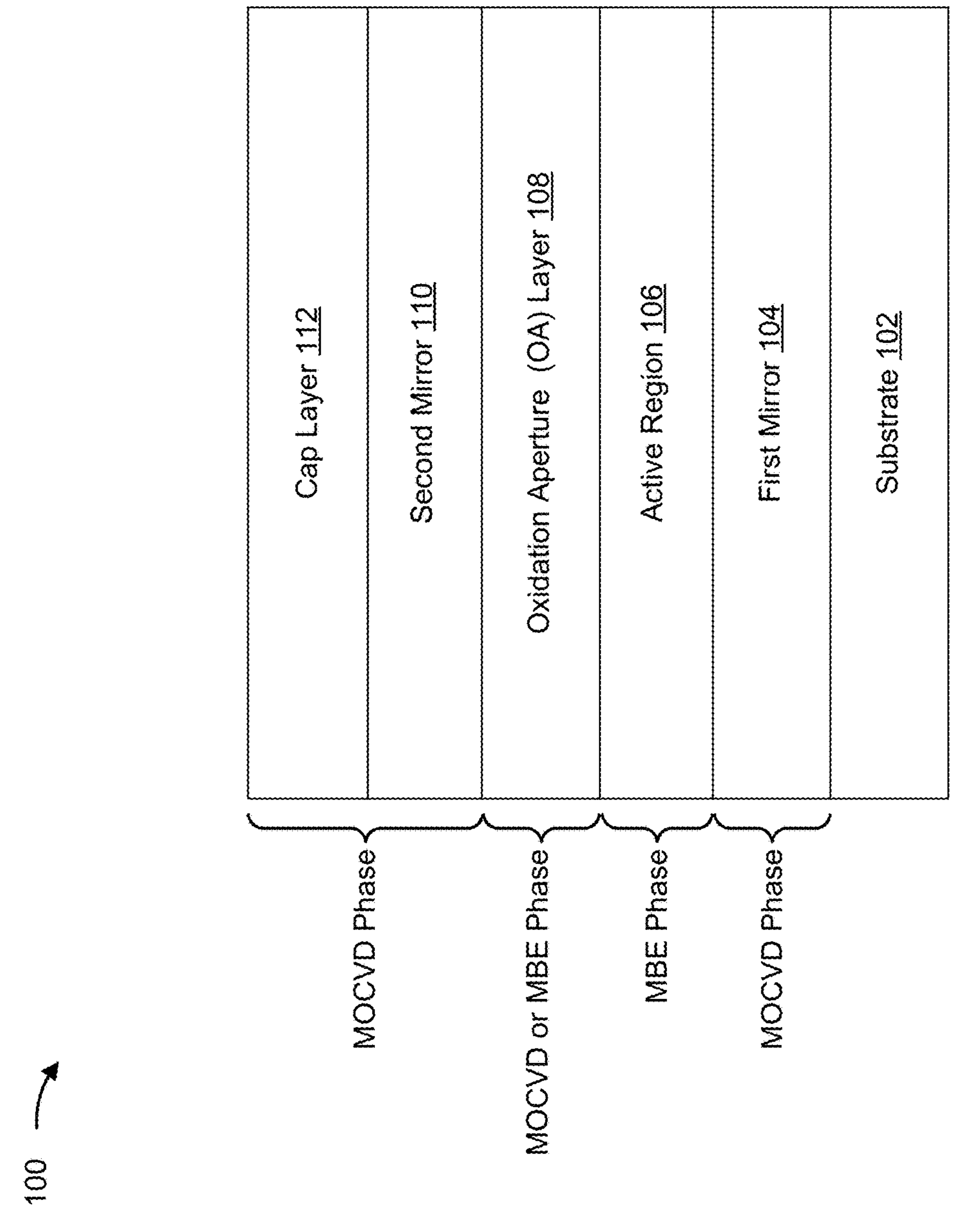
FIG. 1 is a diagram of an example vertical cavity surface emitting laser (VCSEL) device described herein.

The following detailed description of example implementations refers to the accompanying drawings. The same reference numbers in different drawings may identify the same or similar elements.

A conventional laser device may be created by depositing different material layers on a substrate. For example, a single deposition process (e.g., a metal-organic chemical vapor deposition (MOCVD) process or a molecular beam epitaxy (MBE) process) may be used to form a set of reflectors and an active region on a substrate. Often, however, the deposition process may be suitable for forming some layers, such as reflectors, but not for others, such as an active region (or vice versa). In some cases, this creates low quality layers and/or structures within the conventional laser device, which introduces defects or allows defects to propagate through the conventional laser device. This can degrade a performance, manufacturability, and/or a reliability of the conventional laser device.

Some implementations described herein provide a multiphase growth sequence for forming a vertical cavity surface emitting laser (VCSEL). In some implementations, the multiphase growth sequence includes forming, on a substrate, a first set of layers and/or structures using a first MOCVD process during a first MOCVD phase, a second set of layers and/or structures using an MBE process during an MBE phase, and a third set of layers and/or structures using a second MOCVD process during a second MOCVD phase. The first set of layers and/or structures may include a first mirror, the second set of layers and/or structures may include an active region (e.g., a dilute nitride active region or an active region with indium gallium arsenide (InGaAs) or indium arsenide (InAs) quantum dot layers), and the third set of layers and/or structures may include a second mirror. In some implementations, the multiphase growth sequence includes forming, on a substrate, a first set of layers and/or structures using an MBE process during an MBE phase and a second set of layers and/or structures using an MOCVD process during an MOCVD phase. The first set of layers and/or structures may include a first mirror and an active region (e.g., a dilute nitride active region or active region with InGaAs or InAs quantum dot layers), and the second set of layers and/or structures may include a second mirror.

In this way, using a multiphase growth sequence enables formation of high quality layers and/or structures within the VCSEL device. For example, an MOCVD process, which forms high quality mirrors (e.g., high quality distributed Bragg reflectors (DBRs)), is used during an MOCVD phase to form the first mirror and/or the second mirror. As another example, an MBE process, which forms high quality active regions (e.g., high quality active regions with dilute nitride quantum wells and/or InGaAs or InAs quantum dot layers), is used during an MBE phase to form the active region. Accordingly, creation of high quality layers and/or structures within the VCSEL device reduces a likelihood of defects or a propagation of defects through the VCSEL device. Therefore, using a multiphase growth sequence to form a VCSEL device improves a performance, manufacturability, and/or a reliability of the VCSEL device, as compared to a VCSEL device formed using a single deposition process.

FIG. 1 is a diagram of an example VCSEL device 100 described herein. The VCSEL device 100 may include, for example, a short-wave infrared (SWIR) VCSEL device, an oxide confined VCSEL device, an implant confined VCSEL device, a mesa confined VCSEL device, a top emitting VCSEL device, or a bottom emitting VCSEL device. In some implementations, the VCSEL device 100 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 1, the VCSEL device 100 may include a substrate 102, a first mirror 104, an active region 106, an oxidation aperture (OA) layer 108, a second mirror 110, and/or a cap layer 112.

The substrate 102 may include a substrate upon which other layers and/or structures shown in FIG. 1 are grown. The substrate 102 may include a semiconductor material, such as gallium arsenide (GaAs), indium phosphide (InP), germanium (Ge), and/or another type of semiconductor material. In some implementations, the substrate may be an n-doped substrate, such as an n-type GaAs substrate, an n-type InP substrate, or an n-type Ge substrate.

The first mirror 104 may be disposed over the substrate 102. For example, the first mirror 104 may be disposed on (e.g., directly on) a surface of the substrate 102 or on one or more intervening layers or structures (e.g., one or more spacers, one or more cladding layers, and/or other examples) between the substrate 102 and the first mirror 104. The first mirror 104 may include a reflector, such as a dielectric DBR or a semiconductor DBR. For example, the first mirror 104 may include a set of alternating semiconductor layers, such as a set of alternating GaAs layers and aluminum gallium arsenide (AlGaAs) layers or a set of alternating low aluminum (Al) percentage AlGaAs layers and high Al percentage AlGaAs layers. In some implementations, the first mirror 104 may be an n-doped DBR. For example, the first mirror 104 may include a set of alternating n-doped GaAs (n-GaAs) layers and n-doped AlGaAs (n-AlGaAs) layers.

The active region 106 may be disposed over the first mirror 104. For example, the active region 106 may be disposed on (e.g., directly on) a surface of the first mirror 104 or on one or more intervening layers (e.g., one or more spacers, one or more cladding layers, and/or other examples) between the first mirror 104 and the active region 106. The active region 106 may include one or more layers where electrons and holes recombine to emit light (e.g., as an output beam) and define an emission wavelength range of the VCSEL device 100. For example, the active region 106 may include one or more quantum wells, such as at least one dilute nitride quantum well (e.g., a gallium indium nitride arsenide (GaInNAs) quantum well and/or a gallium indium nitride arsenide antimonide (GaInNAsSb) quantum well), and/or one or more quantum dot layers, such as at least one indium gallium arsenide (InGaAs) or indium arsenide (InAs) quantum dot layer.

The OA layer 108 may be disposed over the active region 106. For example, the OA layer 108 may be disposed on (e.g., directly on) a surface of the active region 106 or on one or more intervening layers (e.g., one or more spacers, one or more cladding layers, and/or other examples) between the active region 106 and the OA layer 108. The OA layer 108 may include a group of layers associated with controlling one or more characteristics of the output beam emitted by the VCSEL device 100. For example, the OA layer 108 may include one or more layers to enhance a lateral confinement on carriers, to control an optical confinement of the output beam, and/or to perturb optical modes of the output beam (e.g., to affect a mode pattern in a desired manner). The one or more layers may include a set of alternating oxidized and non-oxidized layers, such as a set of alternating aluminum oxide (AlO) layers and GaAs layers.

The second mirror 110 may be disposed over the OA layer 108. For example, the second mirror 110 may be disposed on (e.g., directly on) a surface of the OA layer 108 or on one or more intervening layers (e.g., one or more spacers, one or more cladding layers, and/or other examples) between the OA layer 108 and the second mirror 110. The second mirror 110 may include a reflector, such as a dielectric DBR or a semiconductor DBR. For example, the second mirror 110 may include a set of alternating semiconductor layers, such as a set of alternating GaAs layers and AlGaAs layers or a set of alternating low Al percentage AlGaAs layers and high Al percentage AlGaAs layers. In some implementations, the second mirror 110 may be a p-doped DBR. For example, the second mirror 110 may include a set of alternating p-doped GaAs (p-GaAs) layers and p-doped AlGaAs (p-AlGaAs) layers.

The cap layer 112 may be disposed over the second mirror 110. For example, the cap layer 112 may be disposed on (e.g., directly on) a surface of the second mirror 110 or on one or more intervening layers (e.g., one or more spacer, one or more cladding layers, and/or other examples) between the second mirror 110 and the cap layer 112. The cap layer 112 may facilitate emission of the output beam from a surface (e.g., a top surface) of the VCSEL device 100. The cap layer 112 may include a semiconductor material, such as GaAs, InGaAs, InP, and/or another type of semiconductor material. In some implementations, the cap layer 112 may be an undoped cap layer (e.g., to facilitate conduction from a metal layer of the VCSEL device 100). For example, the cap layer 112 may include undoped GaAs and/or undoped InP, among other examples. In some implementations, the cap layer 112 may be a p-doped cap layer (e.g., to match optical properties of the second mirror 110 to another layer disposed on a surface of the cap layer 112). For example, the cap layer 112 may include p-doped GaAs (p-GaAs) and/or p-doped InGaAs (p-InGaAs), among other examples.

In some implementations, the VCSEL device 100 may be formed using a multiphase growth sequence, as described herein. For example, as shown in FIG. 1, the first mirror 104 may be formed using a first MOCVD process (also referred to as a metal-organic vapor phase epitaxy (MOVPE) process) during a first MOCVD phase of the multiphase growth sequence and the active region 106 may be formed using a MBE process (e.g., that utilizes nitrogen gas ($N_2$)) during an MBE phase of the multiphase growth sequence. The OA layer 108 may be formed using the MBE process during the MBE phase or using a second MOCVD process (e.g., that is the same or different than the first MOCVD process) during a second MOCVD phase of the multiphase growth sequence. The second mirror 110 and the cap layer 112 may be formed using the second MOCVD process during the second MOCVD phase. As another example, the first mirror 104, the active region 106, and the OA layer 108 may be formed using an MBE process during an MBE phase, and the second mirror 110 and the cap layer 112 may be formed using an MOCVD process during an MOCVD phase.

As indicated above, FIG. 1 is provided as an example. Other examples may differ from what is described with regard to FIG. 1. In practice, the VCSEL device 100 may include additional layers and/or elements, fewer layers and/or elements, different layers and/or elements, or differently arranged layers and/or elements than those shown in FIG. 1.

Figure 2:
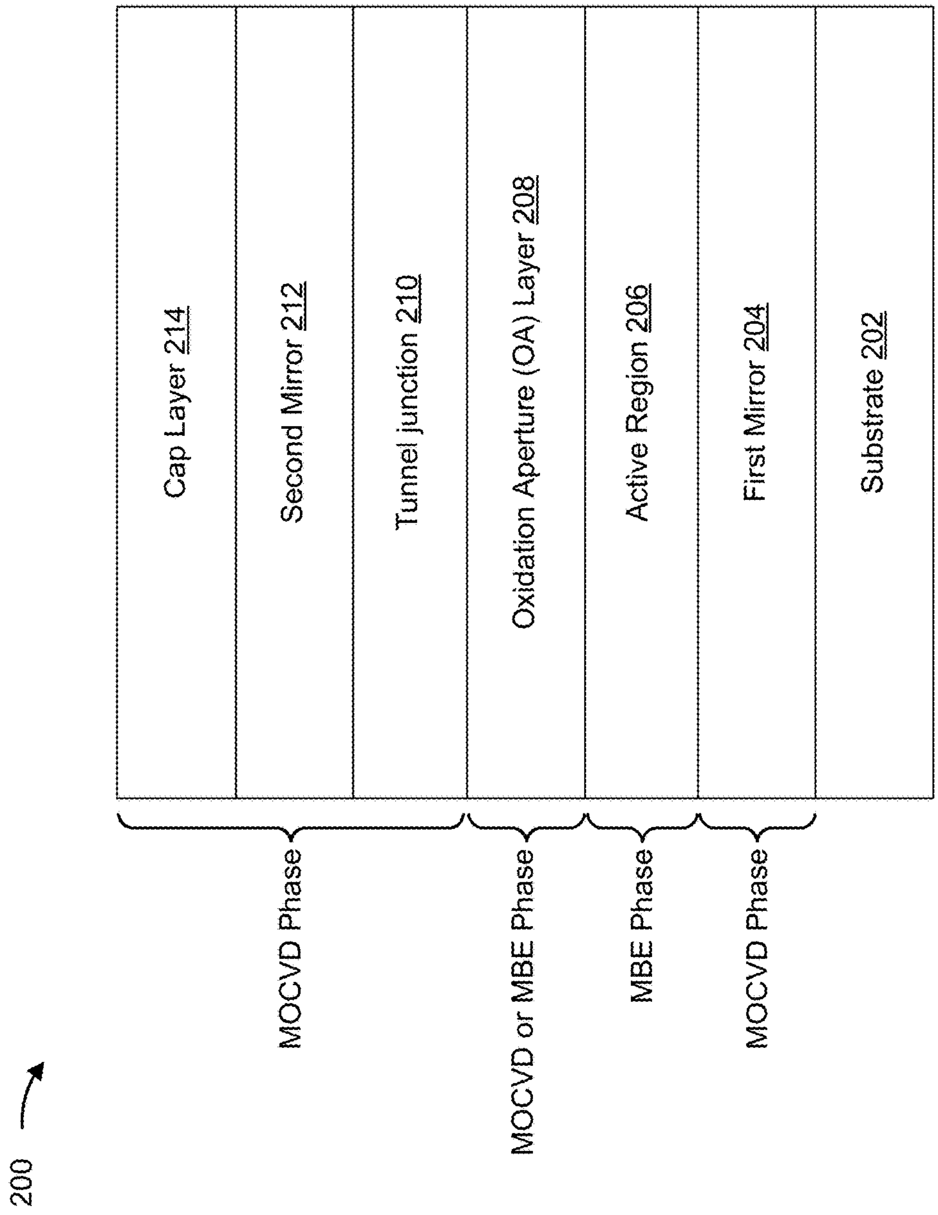
FIG. 2 is a diagram of another example VCSEL device described herein.

FIG. 2 is a diagram of an example VCSEL device 200 described herein. The VCSEL device 200 may include, for example, a SWIR VCSEL device, an oxide confined VCSEL device, an implant confined VCSEL device, a mesa confined VCSEL device, a top emitting VCSEL device, or a bottom emitting VCSEL device. In some implementations, the VCSEL device 200 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 2, the VCSEL device 100 may include a substrate 202, a first mirror 204, an active region 206, an OA layer 208, a tunnel junction 210, a second mirror 212, and/or a cap layer 214.

The substrate 202 may include a substrate upon which other structures shown in FIG. 2 are grown. The substrate 202 may be the same as, or similar to, the substrate 102 described in relation to FIG. 1. For example, the substrate 202 may include a semiconductor material, such as GaAs, InP, Ge, and/or another type of semiconductor material. In some implementations, the substrate may be an n-doped substrate, such as an n-type GaAs substrate, an n-type InP substrate, or an n-type Ge substrate.

The first mirror 204 may be disposed over the substrate 202. For example, the first mirror 204 may be disposed on (e.g., directly on) a surface of the substrate 202 or on one or more intervening layers between the substrate 202 and the first mirror 204. The first mirror 204 may be the same as, or similar to, the first mirror 104 described in relation to FIG. 1. For example, the first mirror 204 may include a reflector, such as a dielectric DBR mirror that includes a set of alternating dielectric layers or a semiconductor DBR that includes a set of alternating GaAs layers and AlGaAs layers. In some implementations, the first mirror 204 may be an n-doped DBR. For example, the first mirror 204 may include a set of alternating n-doped GaAs (n-GaAs) layers and n-doped AlGaAs (n-AlGaAs) layers.

The active region 206 may be disposed over the first mirror 204. For example, the active region 206 may be disposed on (e.g., directly on) a surface of the first mirror 204 or on one or more intervening layers between the first mirror 204 and the active region 206. The active region 206 may be the same as, or similar to, the active region 106 described in relation to FIG. 1. For example, the active region 206 may include one or more quantum wells, such as at least one dilute nitride quantum well (e.g., a GaInNAs quantum well and/or a GaInNAsSb quantum well), and/or one or more quantum dot layers, such as at least one InGaAs or InAs quantum dot layer.

The OA layer 208 may be disposed over the active region 206. For example, the OA layer 208 may be disposed on (e.g., directly on) a surface of the active region 206 or on one or more intervening layers between the active region 206 and the OA layer 208. The OA layer 208 may be the same as, or similar to, the OA layer 108 described in relation to FIG. 1. For example, the OA layer 208 may include a set of alternating oxidized and non-oxidized layers, such as a set of alternating AlO and GaAs layers.

The tunnel junction 210 may be disposed over the OA layer 208. For example, the tunnel junction 210 may be disposed on (e.g., directly on) a surface of the OA layer 208 or on one or more intervening layers between the OA layer 208 and the tunnel junction 210. The tunnel junction 210 may be configured to inject holes into the active region 206. In some implementations, the tunnel junction 210 may include a set of highly doped alternating semiconductor layers, such as a set of alternating highly n-doped semiconductor layers and highly p-doped semiconductor layers. For example, the tunnel junction 210 may include a set of alternating highly n-doped GaAs (n--GaAs) layers and highly p-doped AlGaAs (p+-AlGaAs) layers (or vice versa).

The second mirror 212 may be disposed over the tunnel junction 210. For example, the second mirror 212 may be disposed on (e.g., directly on) a surface of the tunnel junction 210 or on one or more intervening layers between the tunnel junction 210 and the second mirror 212. The second mirror 212 may be the same as, or similar to, the second mirror 110 described in relation to FIG. 1. For example, the second mirror 212 may include a reflector, such as a dielectric DBR mirror that includes a set of alternating dielectric layers or a semiconductor DBR that includes a set of alternating GaAs layers and AlGaAs layers. In some implementations, the second mirror 212 may be an n-doped DBR. For example, the second mirror 212 may include a set of alternating n-doped GaAs (n-GaAs) layers and n-doped AlGaAs (n-AlGaAs) layers.

The cap layer 214 may be disposed over the second mirror 212. For example, the cap layer 214 may be disposed on (e.g., directly on) a surface of the second mirror 212 or on one or more intervening layers (e.g., one or more spacer, one or more cladding layers, and/or other examples) between the second mirror 212 and the cap layer 214. The cap layer 214 may facilitate emission of the output beam from a surface (e.g., a top surface) of the VCSEL device 200. The cap layer 214 may include a semiconductor material, such as GaAs, InGaAs, InP, and/or another type of semiconductor material. In some implementations, the cap layer 214 may be an undoped cap layer (e.g., to facilitate conduction from a metal layer of the VCSEL device 200). For example, the cap layer 214 may include undoped GaAs and/or undoped InP, among other examples. In some implementations, the cap layer 214 may be an n-doped cap layer (e.g., to match optical properties of the second mirror 212 to another layer disposed on a surface of the cap layer 214). For example, the cap layer 214 may include n-doped GaAs (n-GaAs) and/or n-doped InGaAs (n-InGaAs), among other examples.

In some implementations, the VCSEL device 200 may be formed using a multiphase growth sequence, as described herein. For example, as shown in FIG. 2, the first mirror 204 may be formed using a first MOCVD process during a first MOCVD phase of the multiphase growth sequence and the active region 206 may be formed using a using an MBE process (e.g., that utilizes $N_2$) during an MBE phase of the multiphase growth sequence. The OA layer 208 may be formed using the MBE process during the MBE phase or using a second MOCVD process (e.g., that is the same or different than the first MOCVD process) during a second MOCVD phase of the multiphase growth sequence. The tunnel junction 210, the second mirror 212, and the cap layer 214 may be formed using the second MOCVD process during the second MOCVD phase. As another example, the first mirror 204, the active region 206, and the OA layer 208 may be formed using an MBE process during an MBE phase, and the tunnel junction 210, the second mirror 212, and the cap layer 214 may be formed using an MOCVD process during an MOCVD phase.

As indicated above, FIG. 2 is provided as an example. Other examples may differ from what is described with regard to FIG. 2. In practice, the VCSEL device 200 may include additional layers and/or elements, fewer layers and/or elements, different layers and/or elements, or differently arranged layers and/or elements than those shown in FIG. 2.

Figure 3:
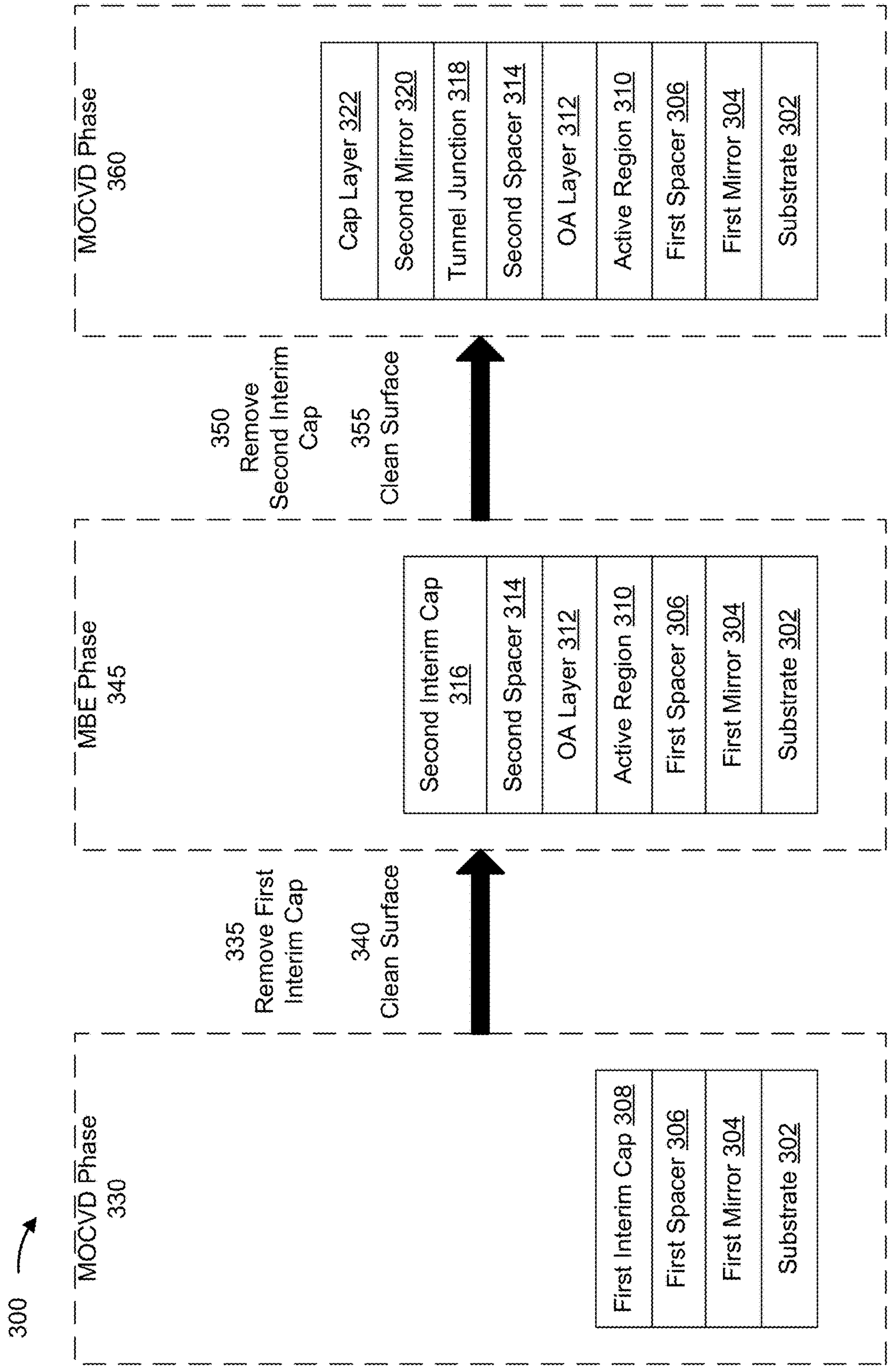
FIG. 3 is a diagram of an example implementation of a multiphase growth sequence for forming a VCSEL device.

FIG. 3 is a diagram of an example implementation 300 of a multiphase growth sequence for forming a VCSEL device (e.g., a VCSEL device that is the same as, or similar to, the VCSEL device 100 or the VCSEL device 200 described in relation to FIGS. 1-2). As shown in FIG. 3, the VCSEL device may be formed by forming a substrate 302, a first mirror 304, a first spacer 306, a first interim cap 308, an active region 310, an OA layer 312, a second spacer 314, a second interim cap 316, a tunnel junction 318, a second mirror 320, and/or a cap layer 322. The substrate 302, the first mirror 304, the active region 310, the OA layer 312, the tunnel junction 318, the second mirror 320, and/or the cap layer 322 may be the same as, or similar to, corresponding structures and/or layers described herein in relation to FIGS. 1-2.

As shown in FIG. 3, the multiphase growth sequence may include a first MOCVD phase 330. During the first MOCVD phase 330, a first MOCVD process may be used to form one or more layers of an epitaxial structure (e.g., that will become the VCSEL device). For example, as shown in FIG. 3, the first MOCVD process may be used to form the first mirror 304 over the substrate 302, to form a first portion of the first spacer 306 over the first mirror 304, and/or to form the first interim cap 308 over the first portion of the first spacer 306. The first spacer 306 may be configured to align a standing wave of an optical field of the VCSEL device with a regrowth interface, as further described herein in relation to FIG. 5A. In some implementations, the first spacer 306 may include one or more undoped semiconductor layers, such as one or more undoped GaAs layers and/or one or more n-doped GaAs layers. The first interim cap 308 may include a group of layers associated with preventing oxidation of the first mirror 304 and/or the first spacer 306 (e.g., during a transition between the first MOCVD phase 330 and an MBE phase 345). In some implementations, the first interim cap 308 may include one or more semiconductor layers, such as one or more layers comprising indium arsenide (InAs).

As further shown in FIG. 3, after the first MOCVD phase 330 has finished, the multiphase growth sequence may include one or more transitional processing steps that are performed during a transition period (e.g., one or more steps to be performed after the first MOCVD phase 330 and before the MBE phase 345). As shown by reference number 335, the multiphase growth sequence may include removing (or causing to be removed) the first interim cap 308. For example, the epitaxial structure formed by the first MOCVD phase 330 may be physically moved from a MOCVD processing environment to an MBE processing environment. After the epitaxial structure has been moved to the MBE processing environment, the first interim cap 308 is no longer needed to protect the first mirror 304 and/or the first spacer 306. Accordingly, the multiphase growth sequence may include evaporation, etching, or another removal process, to remove the first interim cap 308 from the epitaxial structure. Additionally, or alternatively, as shown by reference number 340, the multiphase growth sequence may include cleaning of a surface of the epitaxial structure (e.g., a top surface of the epitaxial structure). For example, the multiphase growth sequence may include using a hydrogen (H and/or H+) plasma cleaning process. In this way, defects may be removed from the surface of the epitaxial structure (e.g., a regrowth surface of the first spacer 306, when the first spacer 306 is present in the epitaxial structure, or a top surface of the first mirror 304, when the first spacer 306 is not present in the epitaxial structure).

As further shown in FIG. 3, the multiphase growth sequence may include the MBE phase 345. During the MBE phase 345, an MBE process may be used to form one or more of the layers the epitaxial structure (e.g., on the substrate 302). For example, as shown in FIG. 3, the MBE process may be used to form a second portion of the first spacer 306 over the first portion of the first spacer 306 (e.g., to fully form the first spacer 306), the active region 310 over the first spacer 306, the OA layer 312 over the active region 310, a first portion of the second spacer 314 over the OA layer 312, and/or the second interim cap 316 over the first portion of the second spacer 314. The second spacer 314 may be configured to align the standing wave of the optical field of the VCSEL device with a regrowth interface, as further described herein in relation to FIG. 5B. In some implementations, the second spacer 314 may include one or more undoped semiconductor layers, such as one or more undoped GaAs layers, one or more n-doped GaAs layers, and/or one or more p-doped GaAs layers. The second interim cap 316 may include a group of layers associated with preventing oxidation of the first mirror 304, the first spacer 306, the active region 310, the OA layer 312, and/or the second spacer 314 (e.g., during a transition between the MBE phase 345 and a second MOCVD phase 360). In some implementations, the second interim cap 316 may include one or more semiconductor layers, such as one or more layers comprising InAs and/or arsenic (As).

As further shown in FIG. 3, after the MBE phase 345 has finished, the multiphase growth sequence may include one or more transitional processing steps that are performed during a transition period (e.g., one or more steps to be performed after the MBE phase 345 and before the second MOCVD phase 360). As shown by reference number 350, the multiphase growth sequence may include removing (or causing to be removed) the second interim cap 316. For example, the epitaxial structure formed by the first MOCVD phase 330 and the MBE phase 345 may be physically moved from the MBE processing environment to another MOCVD processing environment (e.g., that is the same as or different from the MOCVD processing environment described above). After the epitaxial structure has been moved to the other MOCVD processing environment, the second interim cap 316 is no longer needed to protect the first mirror 304, the first spacer 306, the active region 310, the OA layer 312, and/or the second spacer 314. Accordingly, the multiphase growth sequence may include evaporation, etching, or another removal process, to remove the second interim cap 316 from the epitaxial structure. Additionally, or alternatively, as shown by reference number 355, the multiphase growth sequence may include cleaning of a surface of the epitaxial structure (e.g., a top surface of the epitaxial structure). For example, the multiphase growth sequence may include using a hydrogen (H and/or H+) plasma cleaning process. In this way, defects may be removed from the surface of the epitaxial structure (e.g., a regrowth surface of the second spacer 314, when the second spacer 314 is present in the epitaxial structure, or a top surface of the OA layer 312, when the second spacer 314 is not present in the epitaxial structure).

As further shown in FIG. 3, the multiphase growth sequence may include the second MOCVD phase 360. During the second MOCVD phase 360, a second MOCVD process may be used to form one or more layers of the epitaxial structure. For example, as shown in FIG. 3, the second MOCVD process may be used to form a second portion of the second spacer 314 over the first portion of the second spacer 314 (e.g., to fully form the second spacer 315), the tunnel junction 318 over the second spacer 314, the second mirror 320 over the tunnel junction 318, and/or the cap layer 322 over the second mirror 320. Accordingly, after the second MOCVD phase 360 has finished, the VCSEL device is formed (e.g., that includes the epitaxial structure formed by the first MOCVD phase 330, the MBE phase 345, and the second MOCVD phase 360).

As indicated above, FIG. 3 is provided as an example. Other examples may differ from what is described with regard to FIG. 3. In practice, the multiphase growth sequence may include forming additional layers and/or elements, fewer layers and/or elements, different layers and/or elements, or differently arranged layers and/or elements than those shown in FIG. 3.

Figure 4:
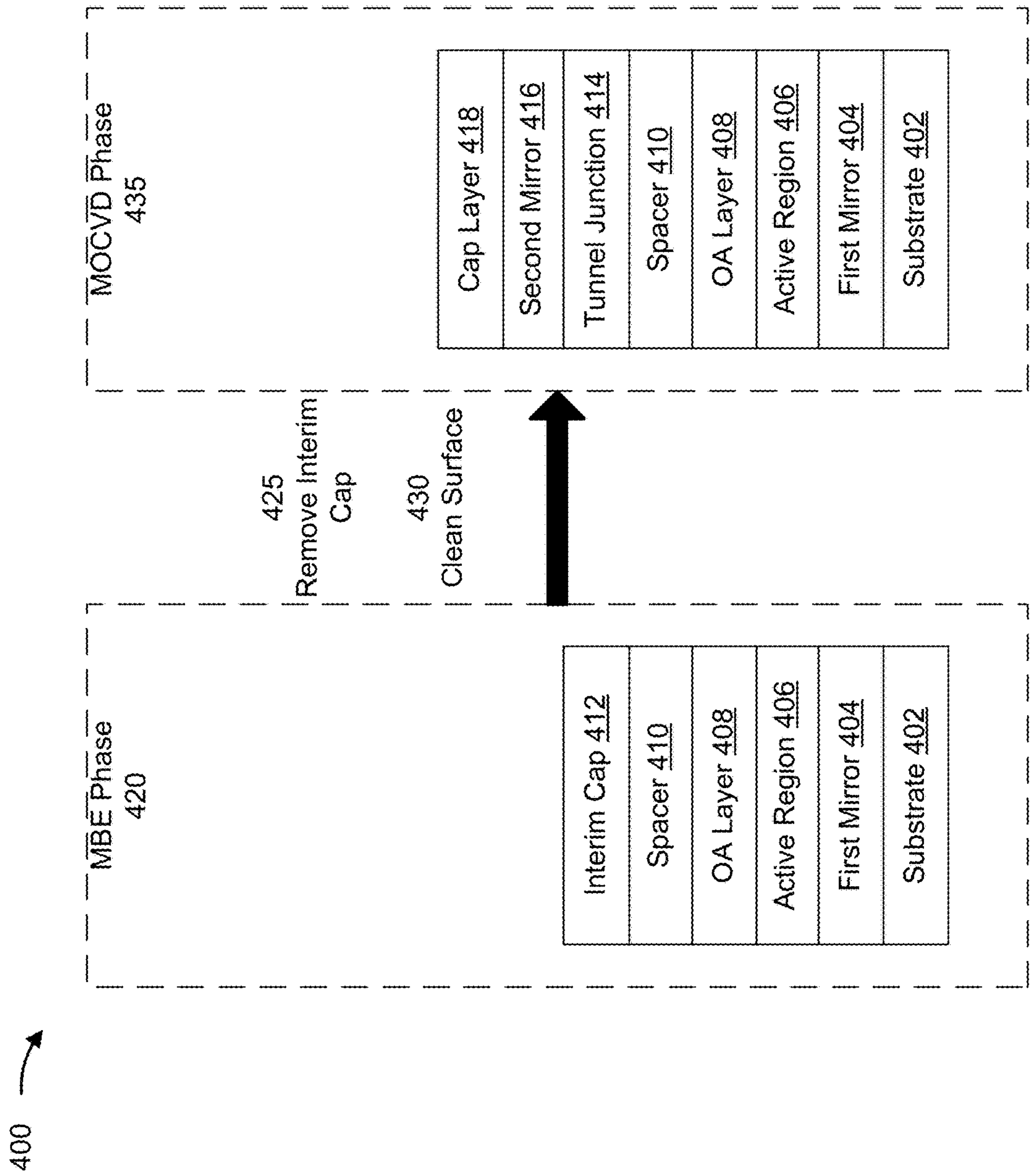
FIG. 4 is a diagram of another example implementation of a multiphase growth sequence for forming a VCSEL device.

FIG. 4 is a diagram of an example implementation 400 of a multiphase growth sequence for forming a VCSEL device (e.g., a VCSEL device that is the same as, or similar to, the VCSEL device 100 or the VCSEL device 200 described in relation to FIGS. 1-2). As shown in FIG. 4, the VCSEL device may be formed by forming a substrate 402, a first mirror 404, an active region 406, an OA layer 408, a spacer 410, an interim cap 412, a tunnel junction 414, a second mirror 416, and/or a cap layer 418. The substrate 402, the first mirror 404, the active region 406, the OA layer 408, the interim cap 412, the tunnel junction 414, the second mirror 416, and/or the cap layer 418 may be the same as, or similar to, corresponding structures and/or layers described herein in relation to FIGS. 1-3.

As shown in FIG. 4, the multiphase growth sequence may include an MBE phase 420. During the MBE phase 420, an MBE process may be used to form one or more layers of an epitaxial structure (e.g., that will become the VCSEL device). For example, as shown in FIG. 4, the MBE process may be used to form the first mirror 404 over the substrate 402, to form the active region 406 over the first mirror 404, to form the OA layer 408 over the active region 406, to form a first portion of the spacer 410 over the OA layer 408, and/or to form the interim cap 412 over the first portion of the spacer 410. The spacer 410 may be configured to align a standing wave of an optical field of the VCSEL device with a regrowth interface, as further described herein in relation to FIG. 5B. In some implementations, the spacer 410 may include one or more undoped semiconductor layers, such as one or more undoped GaAs layers, one or more n-doped GaAs layers, and/or one or more p-doped GaAs layers. The interim cap 412 may include a group of layers associated with preventing oxidation of the first mirror 404, the active region 406, the OA layer 408, and/or the spacer 410 (e.g., during a transition between the MBE phase 420 and an MOCVD phase 435). In some implementations, the interim cap 412 may include one or more semiconductor layers, such as one or more layers comprising InAs and/or As.

As further shown in FIG. 4, after the MBE phase 420 has finished, the multiphase growth sequence may include one or more transitional processing steps that are performed during a transition period (e.g., one or more steps to be performed after the MBE phase 420 and before the MOCVD phase 435). As shown by reference number 425, the multiphase growth sequence may include removing (or causing to be removed) the interim cap 412. For example, the epitaxial structure formed by the MBE phase 420 may be physically moved from an MBE processing environment to an MOCVD processing environment. After the epitaxial structure has been moved to the MOCVD processing environment, the interim cap 412 is no longer needed to protect the first mirror 404, the active region 406, the OA layer 408, and/or the spacer 410. Accordingly, the multiphase growth sequence may include evaporation, etching, or another removal process, to remove the interim cap 412 from the epitaxial structure. Additionally, or alternatively, as shown by reference number 430, the multiphase growth sequence may include cleaning of a surface of the epitaxial structure (e.g., a top surface of the epitaxial structure). For example, the multiphase growth sequence may include using a hydrogen (H and/or H+) plasma cleaning process. In this way, defects may be removed from the surface of the epitaxial structure (e.g., a regrowth surface of the spacer 410, when the spacer 410 is present in the epitaxial structure, or a top surface of the OA layer 408, when the spacer 410 is not present in the epitaxial structure).

As further shown in FIG. 4, the multiphase growth sequence may include the MOCVD phase 435. During the MOCVD phase 435, an MOCVD process may be used to form one or more of the layers of the epitaxial structure. For example, as shown in FIG. 4, the MOCVD process may be used to form a second portion of the spacer 410 over the first portion of the spacer 410 (e.g., to fully form the spacer 410), the tunnel junction 414 over the spacer 410, the second mirror 416 over the tunnel junction 414 and/or the cap layer 418 over the second mirror 416. Accordingly, after the MOCVD phase 435 has finished, the VCSEL device is formed (e.g., that includes the epitaxial structure formed by the MBE phase 420 and the MOCVD phase 435).

As indicated above, FIG. 4 is provided as an example. Other examples may differ from what is described with regard to FIG. 4. In practice, the multiphase growth sequence may include forming additional layers and/or elements, fewer layers and/or elements, different layers and/or elements, or differently arranged layers and/or elements than those shown in FIG. 4.

Figure 5A:
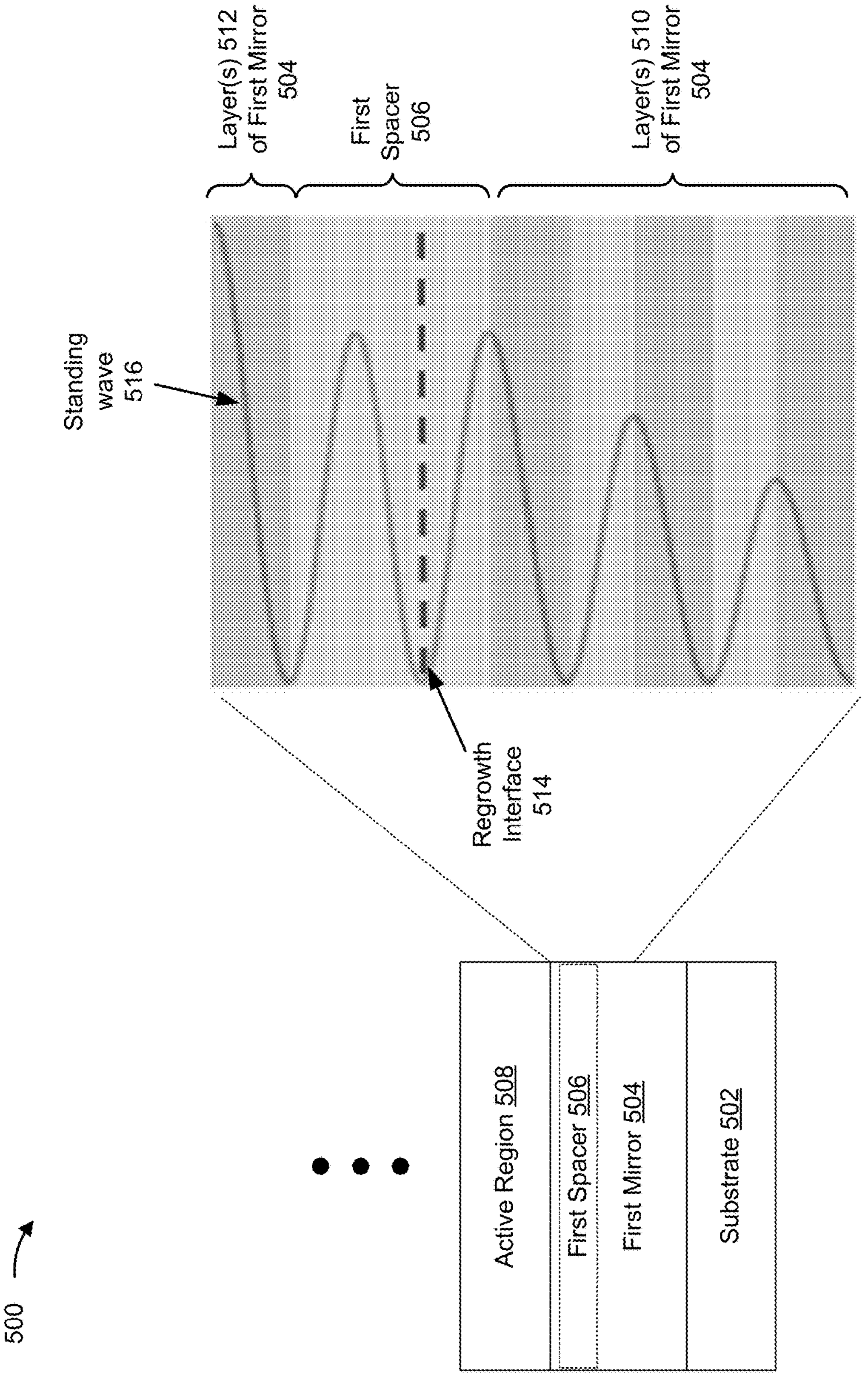
FIGS. 5A-5B are diagrams of example implementations of portions of a VCSEL device formed using a multiphase growth sequence described herein.
Figure 5B:
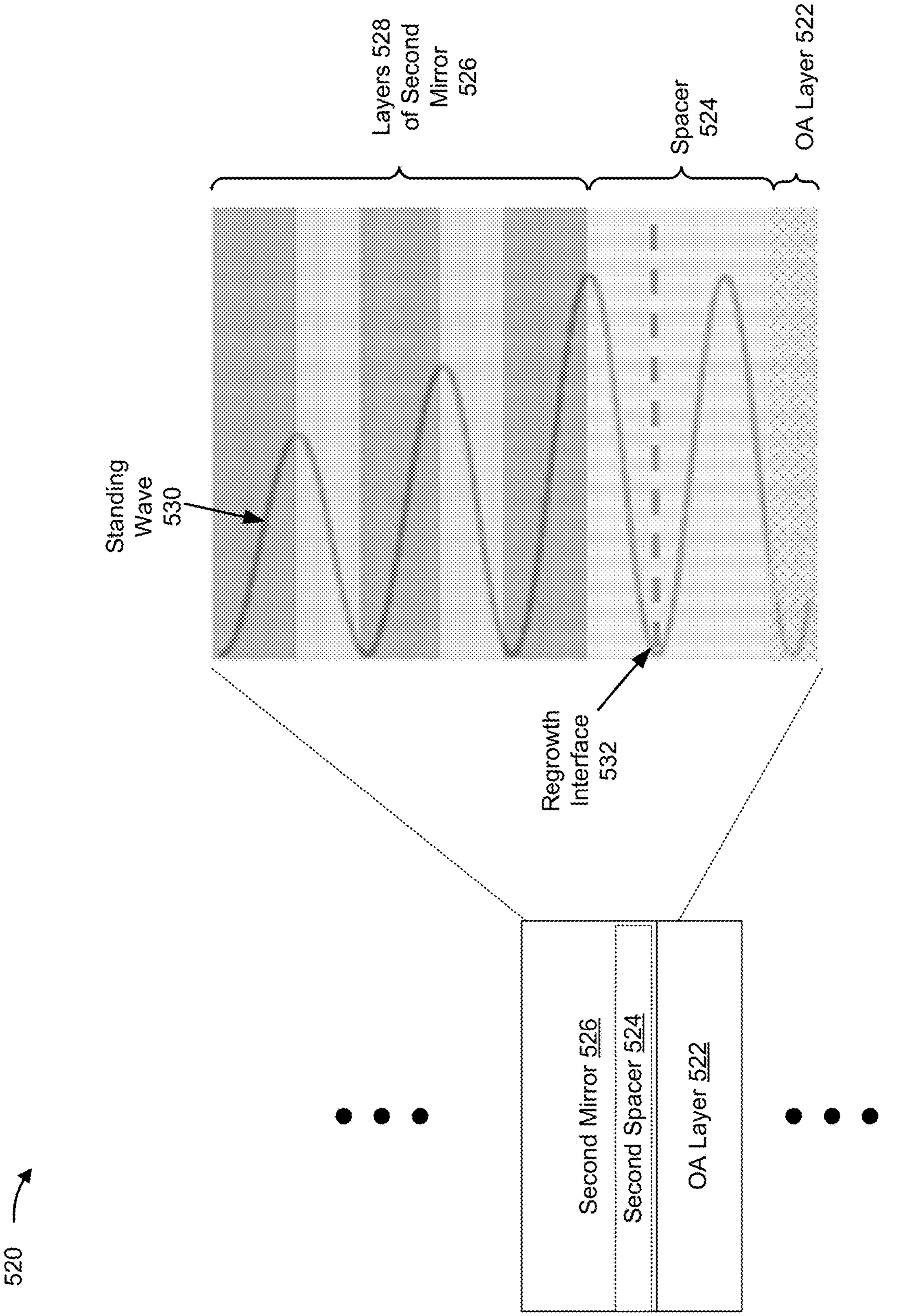

FIGS. 5A-5B are diagrams of example implementations 500 and 520 of portions of a VCSEL device (e.g., a VCSEL device that is the same as, or similar to, the VCSEL device 100 or the VCSEL device 200 described in relation to FIGS. 1-2) formed using a multiphase growth sequence described herein (e.g., in relation to FIGS. 3-4). As shown in FIG. 5A, in implementation 500, a VCSEL device may include a substrate 502, a first mirror 504, a first spacer 506, and/or an active region 508 (e.g., that are the same as, or similar to, corresponding structures and/or layers described herein in relation to FIGS. 1-4). As further shown in FIG. 5A, the first spacer 506 may be included in the first mirror 504. For example, the first mirror 504 may include a first set of layers 510 (e.g., a set of alternating GaAs layers and AlGaAs layers) and a second set of layers 512 (e.g., a set of alternating GaAs layers and AlGaAs layers, or a single layer of GaAs or AlGaAs), and the first spacer 506 may be disposed between the first set of layers 510 and the second set of layers 512. In this way, the first spacer 506 may be formed when forming the first mirror 504 (e.g., using the multiphase growth sequence described herein), rather than formed as a separate layer or structure after forming the first mirror 504.

As further shown in FIG. 5A, the first spacer 506 may have an optical thickness that is equal to an odd multiple of a quarter wavelength (X) of a standing wave 516 of an optical field of the VCSEL device. For example, the optical thickness of the first spacer 506 may be 1/4λ, 3/4λ, or 5/4λ and so on. In this way, the optical thickness of the first spacer 506 causes a regrowth interface 514 to coincide with a local minimum of the standing wave of the optical field of the VCSEL device. The regrowth interface 514 may be a position within the VCSEL device that indicates where the VCSEL device was transferred from an MOCVD phase to an MBE phase (e.g., as described herein in relation to FIG. 3). The regrowth interface 514 may be formed by removing a cap and/or cleaning the VCSEL device before starting the MBE phase (e.g., as described herein in relation to FIG. 3 and reference numbers 335 and 340). As part of the MBE phase, one or more additional layers may be formed on the regrowth interface 514 to replace any layers of the first spacer 506 and/or the first mirror 504 that may have been removed when removing the cap and/or cleaning the VCSEL device.

As shown in FIG. 5B, in implementation 520, a VCSEL device may include an OA layer 522, a second spacer 524, and/or a second mirror 526 (e.g., that are the same as, or similar to, corresponding structures and/or layers described herein in relation to FIGS. 1-4). As further shown in FIG. 5B, the second spacer 524 may be included in the second mirror 526. For example, the second mirror 526 may include a set of layers 528 (e.g., a set of alternating GaAs layers and AlGaAs layers), and the second spacer 524 may be disposed on an end of the set of layers 528, between the set of layers 528 and the OA layer 522. In this way, the second spacer 524 may be formed when forming the second mirror 526 (e.g., using the multiphase growth sequence described herein), rather than formed as a separate layer or structure after forming the OA layer 522.

As further shown in FIG. 5B, the second spacer 524 may have an optical thickness that is equal to an odd multiple of a quarter wavelength (X) of a standing wave 530 of an optical field of the VCSEL device. For example, the optical thickness of the second spacer 524 may be 1/4λ, 3/4λ, or 5/4λ and so on. In this way, the optical thickness of the second spacer 524 causes a regrowth interface 532 to coincide with a local minimum of the standing wave of the optical field of the VCSEL device. The regrowth interface 532 may be a position within the VCSEL device that indicates where the VCSEL device was transferred from an MBE phase to an MOCVD phase (e.g., as described herein in relation to FIGS. 3-4). The regrowth interface 532 may be formed by removing a cap and/or cleaning the VCSEL device before starting the MOCVD phase (e.g., as described herein in relation to FIG. 3 and reference numbers 350 and 355 and/or FIG. 4 and reference numbers 425 and 430). As part of the MOCVD phase, one or more additional layers may be formed on the regrowth interface 532 to replace any layers of the second spacer 524 and/or the OA layer 522 that may have been removed when removing the cap and/or cleaning the VCSEL device.

As indicated above, FIGS. 5A-5B are provided as examples. Other examples may differ from what is described with regard to FIGS. 5A-5B. In practice, a VCSEL device may include additional layers and/or elements, fewer layers and/or elements, different layers and/or elements, or differently arranged layers and/or elements than those shown in FIGS. 5A-5B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method of forming a vertical cavity surface emitting laser (VCSEL) device using a multiphase growth sequence, comprising:
forming a first mirror over a substrate using a first metal-organic chemical vapor deposition (MOCVD) process during a first MOCVD phase of the multiphase growth sequence;
forming an active region over the first mirror using a molecular beam epitaxy (MBE) process during an MBE phase of the multiphase growth sequence;
forming an oxidation aperture (OA) layer over the active region;
forming, during the MBE phase, a first portion of a spacer on a surface of the OA layer, wherein the spacer comprises gallium arsenide (GaAs);
forming an interim cap over the spacer, wherein the interim cap comprises at least one of indium arsenide (InAs) or arsenic (As);
causing the interim cap and at least a portion of the first portion of the spacer to be removed, such that, after removal, a top surface of the first portion of the spacer coincides with a local minimum of a standing wave of an optical field of the VCSEL device;
forming a second portion of the spacer on the first portion of the spacer using a second MOCVD process during a second MOCVD phase of the multiphase growth sequence and after removal of the interim cap;
forming a tunnel junction over the second portion of the spacer using the second MOCVD process; and
forming a second mirror over the tunnel junction using the second MOCVD process.

2. The method of claim 1,
wherein the VCSEL device is configured to emit an output beam,
wherein the output beam is associated with a wavelength range of 1200-1600 nanometers.

3. The method of claim 1, wherein:
the substrate comprises GaAs;
the active region comprises at least one of a dilute nitride quantum well or an indium gallium arsenide (InGaAs) or InAs quantum dot layer;
the spacer comprises a p-doped GaAs layer;
the first mirror and the second mirror each comprise a set of alternating GaAs layers and aluminum gallium arsenide (AlGaAs) layers; and
the interim cap comprises As.

4. The method of claim 1, wherein:
the first mirror is an n-doped distributed Bragg reflector (DBR); and
the second mirror is a p-doped DBR.

5. The method of claim 1, wherein:
the first mirror is an n-doped distributed Bragg reflector (DBR); and
the second mirror is an n-doped DBR.

6. The method of claim 1, wherein the second mirror is formed on a surface of the tunnel junction.

7. The method of claim 1,
wherein at least one of the first mirror or the OA layer is formed using the MBE process during the MBE phase.

8. The method of claim 1,
wherein the OA layer and the interim cap are formed using the MBE process during the MBE phase, and wherein causing the interim cap to be removed further comprises:
causing the interim cap to be removed before the second mirror is formed using the MOCVD process during the second MOCVD phase.

9. The method of claim 1,
wherein the first mirror is formed using an additional MOCVD process during an additional MOCVD phase, and the method further comprises:
forming an additional spacer on the first mirror using the additional MOCVD process during the additional MOCVD phase.

10. The method of claim 9, further comprising:
forming another interim cap over the additional spacer using the additional MOCVD process during the additional MOCVD phase, and wherein causing the interim cap to be removed further comprises:
causing the other interim cap to be removed before the active region is formed using the MBE process during the MBE phase.

11. The method of claim 1,
wherein the spacer has a particular optical thickness that causes the regrowth interface to coincide with the local minimum.

12. A method of forming a vertical cavity surface emitting laser (VCSEL) device using a multiphase growth sequence, comprising:
forming a first mirror over a substrate using a first metal-organic chemical vapor deposition (MOCVD) process during a first MOCVD phase of the multiphase growth sequence;
forming, during the first MOCVD phase, a first portion of a first spacer on a surface of the first mirror, wherein the first spacer comprises gallium arsenide (GaAs);
forming an interim cap over the first spacer, wherein the interim cap comprises at least one of indium arsenide (InAs) or arsenic (As);
causing the interim cap and at least a portion of the first portion of the first spacer to be removed, such that, after removal, a top surface of the first portion of the first spacer coincides with a local minimum of a standing wave of an optical field of the VCSEL device;
forming a second portion of the first spacer on the first portion of the first spacer using a molecular beam epitaxy (MBE) process during an MBE phase of the multiphase growth sequence and after removal of the interim cap;
forming an active region over the first spacer using the MBE process during the MBE phase;
forming an oxidation aperture (OA) layer over the active region;
forming a second spacer on a surface of the OA layer; and
forming a second mirror over the second spacer using a second MOCVD process during a second MOCVD phase of the multiphase growth sequence.

13. The method of claim 12,
wherein the interim cap is formed using the first MOCVD process during the first MOCVD phase, and wherein causing the interim cap to be removed further comprises:
causing the interim cap to be removed during a transition period between the first MOCVD phase and the MBE phase.

14. The method of claim 13, wherein:
the substrate comprises GaAs;
the active region comprises at least one of a dilute nitride quantum well or an indium gallium arsenide (InGaAs) or InAs quantum dot layer;
the first spacer comprises at least one of an undoped GaAs layer or an n-doped GaAs layer;
the second spacer comprises a p-doped GaAs layer;
the first mirror and the second mirror each comprise a set of alternating GaAs layers and aluminum gallium arsenide (AlGaAs) layers; and
the interim cap comprises As.

15. The method of claim 12, further comprising:
cleaning a surface of the first spacer during a transition period between the first MOCVD phase and the MBE phase.

16. The method of claim 12, further comprising:
forming a tunnel junction on a surface of the second spacer using the second MOCVD process during the second MOCVD phase,
wherein the second mirror is formed on a surface of the tunnel junction.

17. A method of forming a vertical cavity surface emitting laser (VCSEL) device using a multiphase growth sequence, comprising:
forming a first mirror over a substrate;
forming an active region over the first mirror using a molecular beam epitaxy (MBE) process during an MBE phase of the multiphase growth sequence;
forming, during the MBE phase, an oxidation aperture (OA) layer over the active region;
forming, during the MBE phase, a first portion of a spacer on a surface of the OA layer, wherein the spacer comprises gallium arsenide (GaAs);
forming an interim cap over the spacer, wherein the interim cap comprises at least one of indium arsenide (InAs) or arsenic (As);
causing the interim cap and at least a portion of the first portion of the spacer to be removed, such that, after removal, a top surface of the first portion of the spacer coincides with a local minimum of a standing wave of an optical field of the VCSEL device;
forming a second portion of the spacer on the first portion of the spacer using a metal-organic chemical vapor deposition (MOCVD) process during an MOCVD phase of the multiphase growth sequence and after removal of the interim cap;
forming, during the MOCVD phase, a second mirror over the spacer; and
forming, during the MOCVD phase, a cap layer over the second mirror.

18. The method of claim 17,
wherein the interim cap is formed using the MBE process during the MBE phase, and wherein causing the interim cap to be removed further comprises:
causing the interim cap to be removed by an evaporation process during a transition period between the MBE phase and the MOCVD phase.

19. The method of claim 18, wherein:
the substrate comprises GaAs;
the active region comprises at least one of a dilute nitride quantum well or an indium gallium arsenide (InGaAs) or InAs quantum dot layer;
the spacer comprises a p-doped GaAs layer;
the first mirror and the second mirror each comprise a set of alternating GaAs layers and aluminum gallium arsenide (AlGaAs) layers; and
the interim cap comprises As.

20. The method of claim 17, further comprising:
forming a tunnel junction on a surface of the spacer using the MOCVD process during the MOCVD phase,
wherein the second mirror is formed on a surface of the tunnel junction.

* * * * *